United States Patent [19]

Berlekamp et al.

[11] Patent Number: 4,633,486
[45] Date of Patent: Dec. 30, 1986

[54] METHOD AND APPARATUS FOR SYNCHRONIZATION BY COHERENT REINFORCEMENT

[75] Inventors: Elwyn R. Berlekamp; Po Tong, both of Berkeley, Calif.

[73] Assignee: Cyclotomics, Inc., Berkeley, Calif.

[21] Appl. No.: 784,831

[22] Filed: Oct. 4, 1985

Related U.S. Application Data

[62] Division of Ser. No. 518,213, Jul. 28, 1985, Pat. No. 4,559,625.

[51] Int. Cl.⁴ ............................................. H04L 7/08
[52] U.S. Cl. .................................................. 375/116
[58] Field of Search ............................. 375/114–116; 370/100, 105, 107

[56] References Cited

U.S. PATENT DOCUMENTS

| | | | |
|---|---|---|---|
| 3,740,478 | 6/1973 | Breant et al. | 375/115 |
| 3,754,102 | 8/1973 | Clark | 370/105 |
| 3,770,897 | 11/1973 | Haussman et al. | 370/105 |
| 3,798,378 | 3/1974 | Epstein | 370/105 |
| 3,903,371 | 9/1975 | Colton et al. | 375/116 |

OTHER PUBLICATIONS

"Digital Synchronizer"—R. J. Galpin, IBM Technical Disclosure Bulletin, vol. 15, No. 1, Jun. 1972, pp. 81–82.

Primary Examiner—Marc E. Bookbinder
Attorney, Agent, or Firm—E. H. Berkowitz

[57] ABSTRACT

To each bit time of a data block, there is associated a counter which is incremented or decremented in accord with the congruence or non-congruence of the c bit sequence associated with the respective counter (for example, the first bit of the c bit sequence). The counters are initialized to an optimum non-zero value and after receiving a number of blocks of data, each containing one sync symbol, the synchronization is determined from the relative content of the counters.

4 Claims, 18 Drawing Figures

METHOD AND APPARATUS FOR SYNCHRONIZATION BY COHERENT REINFORCEMENT

This application is a division of application Ser. No. 518,213, filed July 28, 1985 now U.S. Pat. No. 4,559,625.

FIELD OF THE INVENTION

The present invention is generally related to apparatus and method for error correction in digital communications and relates particularly to methods and means for resequencing data streams for reduction of burst error.

BACKGROUND OF THE INVENTION

Error correction is implemented most commonly in digital communications through an encoding apparatus at the data source for developing redundant information in a mathematically prescribed manner for transmission over a data channel (which may include information storage media) to a data sink at which an error correction decoder detects, locates, and corrects combinations of errors in the information stream. A well known enhancement for error correction apparatus is achieved by independently encoding a number of information units (hereafter, codewords) and shuffling, or resequencing constituent information subunits of the codewards (hereafter, characters) among the several independently encoded codewords for transmitting the data stream in a particular sequence over the data channel. An inverse operation at the data sink (or receiver) restores the original sequential order of constituent characters and thereby the respective codewords are reconstituted and presented to the decoder for detection of error. This process is known in the art as "interleaving".

It is apparent that interleaving presents a particular enhancement for error correction schemes where bursts of noise or fading of signal in the channel produces a sequence of erasures at the data sink. In such instance, error correction apparatus capable of withstanding some number of errors in a local span of the data stream may be overwhelmed, whereas the resequencing of the data stream more evenly distributes the burst elements over independently encoded regions of the data stream.

It is appropriate to point out that interleaving as discussed herein is distinct from the practice of altering the physical sequencing of information units stored on rotating memory. The object of that practice is the reduction of latency times and optimization for sequential retreival of information units. The physical resequencing to obtain monotonic sequential data retreival is contrasted with the present re-sequencing which is practiced to more uniformly distribute the effects of noise bursts, fading and like signal degradation.

One representative of prior art is the classic block interleaver. This is best understood in a model block interleaver which may be considered as an array of memory elements arranged as N rows of I columns. Assume that encoded information (codewords) comprises N symbols and further that I codewords are to be interleaved (the depth of the interleaver). Symbols enter the interleaver sequentially by columns. Thus codewords reside in respective columns of the array. Output from the block interleaver to the modem occurs serially by rows, thereby producing the desired re-sequencing for exposure to the hazards of transmission. At the receiver, the de-interleaver accepts the data stream for storage by rows. Output from the de-interleaver to the decoder occurs by columns, thereby reconstituting the respective codewords from their interleaved symbols.

A few salient properties of the block interleaver deserve comment. The objective of uniformly distributing burst errors is certainly achieved if the burst length (measured in code symbol intervals) is less than the interleaving depth. In such instance the de-interleaver output will contain no more than a single error in any codeword. If the burst length is in excess of any multiple M of the interleaving depth I, at least M errors will be present in the block of interleaved codewords at the output of the interleaver.

Due to the simple periodicity of the block interleaver, a periodic sequence of single bit errors, spaced in time by the interleaving depth, will result in a single burst of errors at the de-interleaver output. One appreciates that the periodicity of the interleaver necessitates synchronization between interleavers at transmitter and receiver.

Accordingly, it is an object of the present invention to implement a novel and improved interleaver which is greatly reduced in complexity, thereby reducing the number of components required.

It is another object to achieve an interleaver which has greatly reduced requirement for the time period required for synchronization with another like interleaver in communication therewith.

It is yet another object to utilize an interleaving technique which minimizes the effect upon an error correction decoder of the phase or time-of-occurence of a noise burst.

It is one other object of the invention to implement a novel synchronization technique for defining the relative phase of interleaver and de-interleaver.

BRIEF SUMMARY OF THE INVENTION

The present invention accomplishes an interleaving of code words for which the interleaving delay for any symbol varies in accord with the position of such element in the interleaved group of codewords according to a linear relationship of code symbol position (ordinal displacement within the original codeword) to the ordinal relationship of codewords.

The helical interleaving which is described in the present invention is further generalized to provide for degrees of helicity in analogy to the pitch of a helix. Deep or shallow stagger characterizes the (average) symbol interval between correspondingly positioned symbols of adjacent codewords. This is achieved in one embodiment by concatenation of the pure helical interleaver with another interleaver, such as a block interleaver which yields a deep or shallow stagger in the helicity depending upon whether the helical interleaver operates upon previously block interleaved codewords or vice versa, while the quantitative degree of the resulting helicity depends upon the respective interleaving depths of the component interleavers. An alternative embodiment yields a desired degree of stagger by concatenation of symbols and the helical interleaving of the resulting composite symbols.

The operation of an interleaved error correcting decoder system is further enhanced in the presence of long fades or noise bursts through the detection of error in a currently decoded symbol to predict error in a subsequent character which was adjacent the currently decoded symbol in the interleaved sequence during transmission over the channel. Upon confirmation of the incidence of errata in the subsequent codeword, adjacent a codeword containing an erasure, the location of the subsequent error is assumed from the prediction.

The requisite synchrony of interleaver and de-interleaver is accomplished by periodically transmitting a synch symbol in the data stream. The entire data stream is scanned bit by bit for the incidence of the synch character. To each bit there is assigned a counter for recording the probability that the corresponding time increment is the critical synch phase. A bit pattern congruent to the synch character causes incrementation of the counter corresponding to (a particular bit of) the detected bit pattern, and decrement of the same counter if the synch pattern is not detected. Maximum probability is identified with the synchronous phase.

BRIEF DESCRIPTION OF THE FIGURES

FIG. 4b illustrates the coordinatization for the helical interleaving of FIG. 4a.

FIG. 5 is a block diagram for a model helical interleaver.

DETAILED DESCRIPTION OF THE INVENTION

Figure 1:
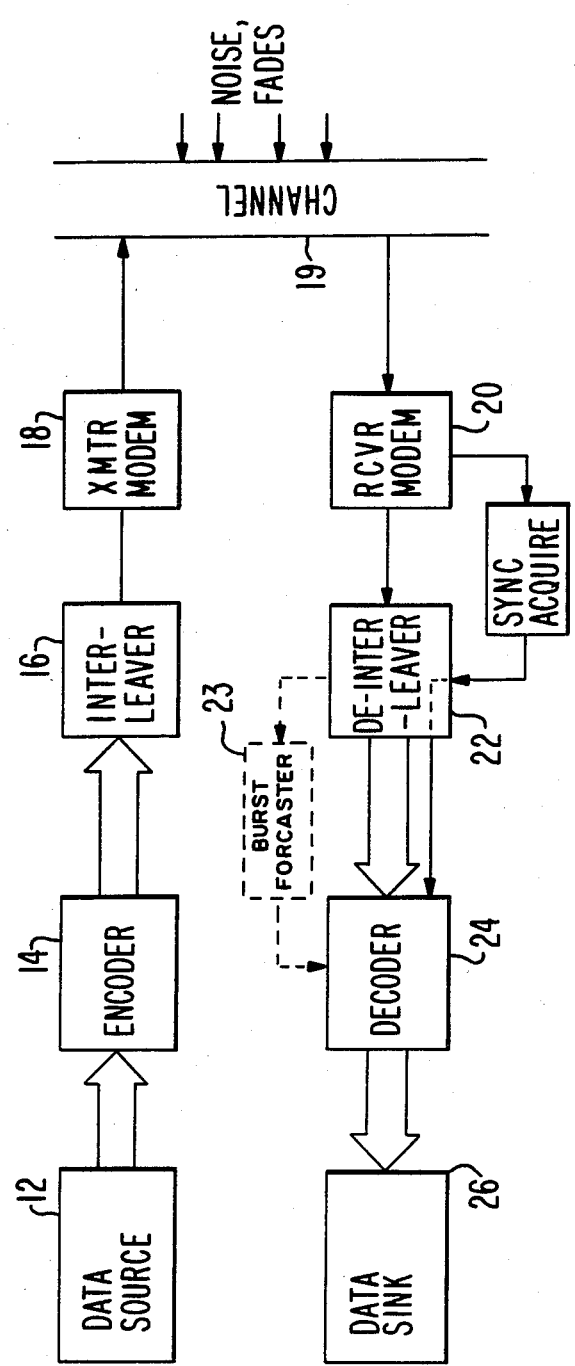
FIG. 1 is a general block diagram of a communication system incorporating interleaving.

The context of the present invention is set forth in FIG. 1 wherein a general digital communication system comprises a transmission subsystem for which digital data from a data source 12 are processed in encoder 14 to yield a stream of symbols forming codewords of n symbols each. An interleaver 16 re-sequences the symbols of a set of consecutive codewords in a predetermined manner after which the modem 18 directs the encoded interleaved information across the channel 19. A receiver/demodulator 20 reproduces the stream of symbols, some of which are possibly degraded by fading, noise and like effects in transmission over the channel 19. The received symbol stream is treated by de-interleaver 22 to perform re-sequencing of the interleaved symbol stream which is the inverse of the operation of the interleaver 16. The now reconstituted codewords, still bearing the effects suffered in transmission over the channel 19, are then presented to the decoder 24 which recovers the original information from erroneous information units (within the error correction capability of the code).

Figure 2:
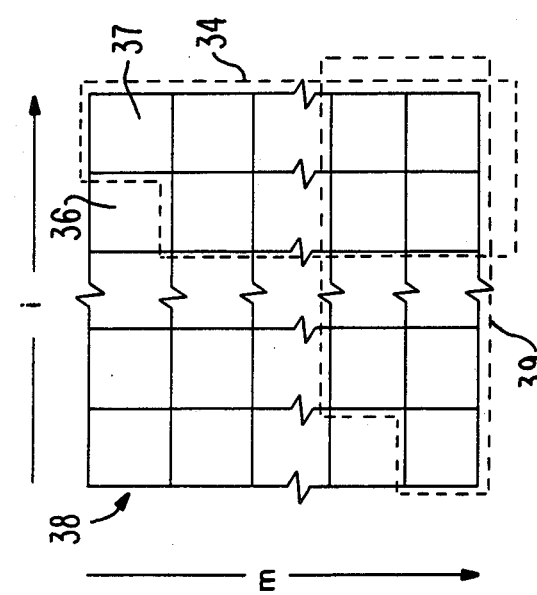
FIG. 2 shows the data organization for a block interleaver.

Turning now to FIG. 2, the organization of data within a conventional block interleaver is illustrated. For simplicity of exposition and specificity, a code of length 4 symbols, interleaved to depth 3 with generalization to length n and depth i is shown. Analysis of the block interleaver is conducted in terms of the delay requisite for its operation. Delay has the connotation of memory requirement as well as time interval units in implementation. Both of these aspects impact the economics of practical interleaver design. For the purpose of this analysis, one may assume that an array of n rows and i columns contains the complete block of i codewords, each of length n. Without loss of generality, one may assume that the code symbols are read into the interleaver sequentially in columns from top to bottom, the columns filled in order from left to right. Output then proceeds serially from the top row symbolically from right to left to form the data stream. Each row in turn is so read out to continue the data stream.

Study of the block interleaver of FIG. 2 yields delays for representative elements of the block as indicated. The general element at row J, column K experiences a delay at the originating modem of $$ni+(i-1)J-(n-1)K$$

and a delay at the destination modem of $$ni+(n-1)K-(i-1)$$

for a total delay of 2ni. This delay is measured from the initial writing of the first code symbol of the first codeword at t=0. In the present work, it has been recognized that this delay can be reduced still further to $2(n-1)(i-1)$. This is accomplished through the recognition that transmission need not be delayed by the full time required to assemble the entire $n \times i$ array, nor must the data stream from the de-interleaver to the decoder await the receipt of the entire $n \times i$ array from the channel. A result of the present approach to block interleaving apparatus is that transmission of interleaved information can be initiated somewhat earlier in time. Assume that the data rates are equal for writing into and reading from the interleaver (and de-interleaver). After assembly of $i-2$ codewords of the $n \times i$ block and the further writing of the initial code symbol of the $(i-1)$ the codeword 36 into the array, it is apparent that the initial interleaved row 38 is now completely assembled but for the initial symbol 37 of the final ($i^{th}$) column. Serial transmission to the modem of this row, comprising the set of i initial (n=1) code symbols, may be commenced at this time and the symbol assembly for the remaining portion 34, comprising $2n-1$ symbols, may be completed or interspersed with transmission of successive rows to the modem in like manner. Reduction in delay and consequent reduction in ram requirement at the interleaver is $2n-1$. A similar improvement of $2i-1$ is achievable at the de-interleaver because of interchange of rows and columns, permitting early transfer to the decoder of the first reassembled codeword. The reduction in delay is here represented by the portion 39 of the de-interleaver. The total interleaving delay for this optimized block interleaving system (interleaver and de-interleaver) is $2ni-((2n-1)+(2i-1))=2(n-1)(i-1)$. Compared to the conventional block interleaving system delay of $2ni$, the improvement is most significant where n and i are both small. For a code length of 4 interleaved to depth 3, a factor of two reduction in delay can be achieved using the optimized block interleaver of the present work.

Figure 3A:
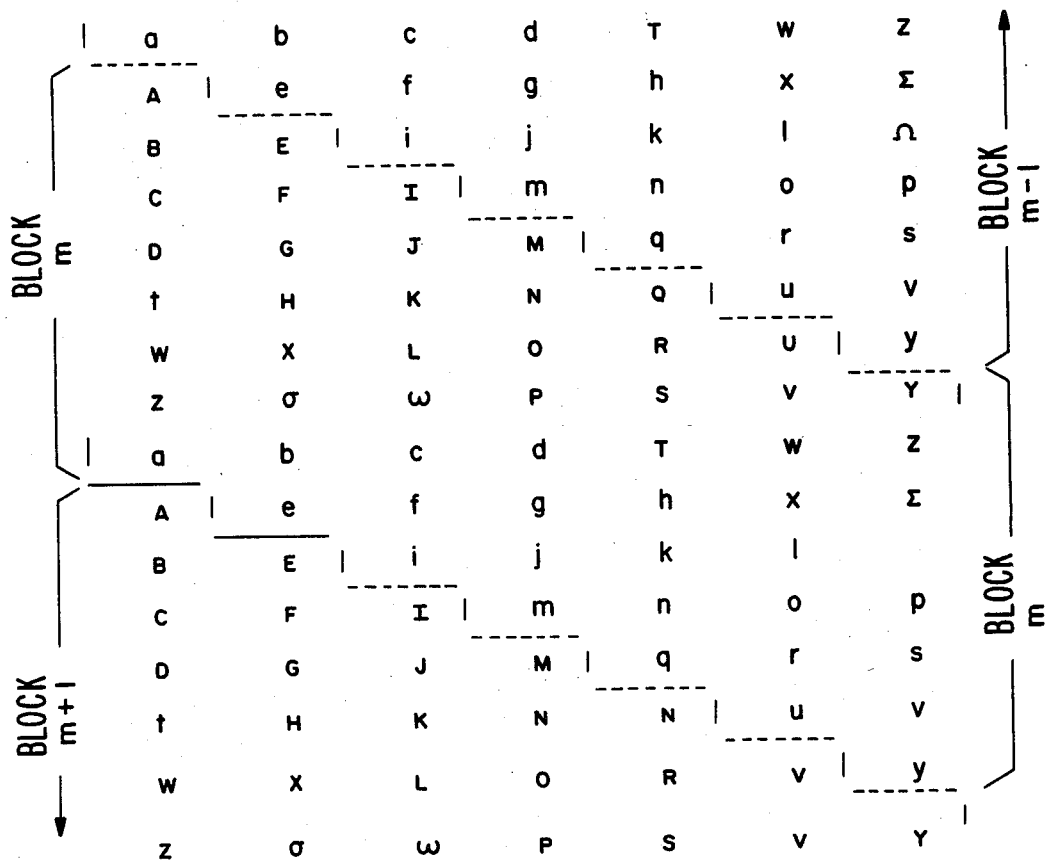
FIGS. 3a shows the data organization of a helical interleaver.
Figure 3B:
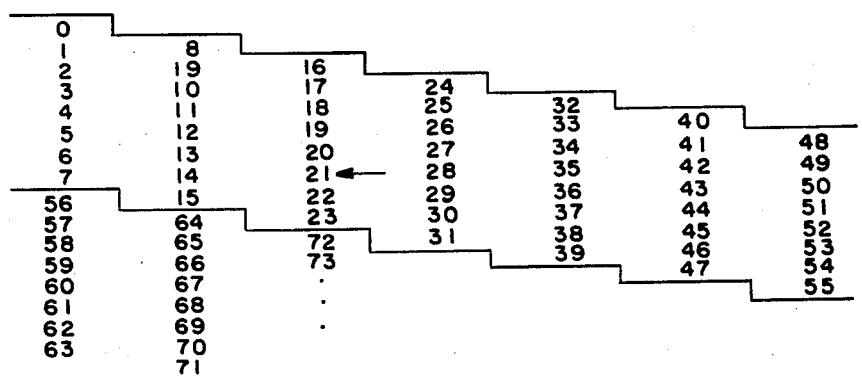
FIG. 3b shows the order in which code symbols are obtained from the encoder.

Turning now to FIGS. 3a and b, there is shown an exemplary organization of data representing a helical interleaver of depth 7 for a code of length 8. In FIG. 3a the abstract addresses are expressly indicated. (A particular relationship of the pairs of addresses represented by upper and lower case designations will appear: as a consequence of efficient implementation, these symbolic address pairs label the identical physical address.) As with the block interleaver, each codeword occupies a column of the block. The data stream is then formed by serializing by rows. It is clear that not only are the code symbols of different codewords of the same block interleaved, so also to some extent are code symbols of codewords from the adjacent block. In FIG. 3b, the elements (interleaved symbols) of the helical array are depicted by the sequential order in which the code symbols have been written into the helical array. If transmission has progressed to the arrow, the bit output from the interleaver to the channel will be taken from the numbered positions 6, 13, 20, 27, 34, 41, 48, 7, 14, 21, ... to continue the serialized data stream. It is useful to consider the addresses which are active in a given interval for the helical interleaving method as exemplified by the FIG. 3a arrangement:

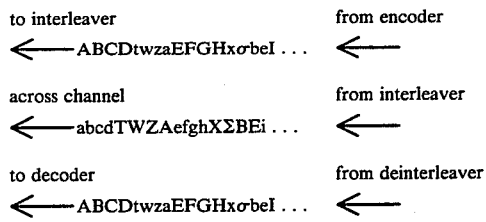

Here the contents of the indicated addresses are considered to propogate from right to left as symbolicaly indicated. The method of realizing this and similar addressing sequences is discussed below.

A preferred implementation of the addressing sequence for a model code of length 8 interleaved to depth 7 will serve to illustrate the invention.

Figures 4A, 4C, 4D:
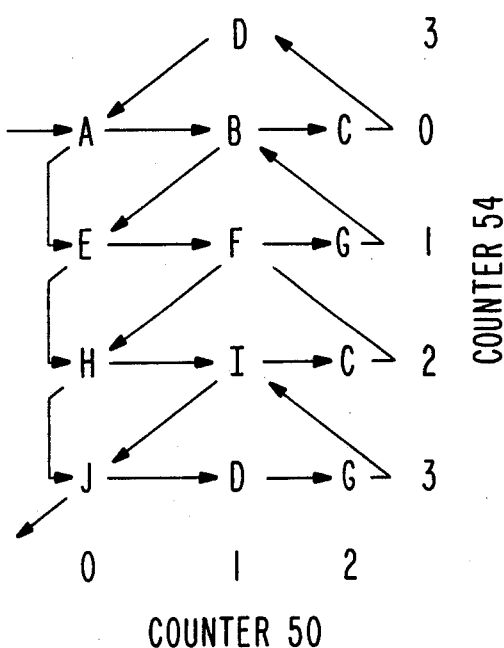
FIG. 4a depicts a (unit) helically interleaved address sequence for code length 8, depth 7.
FIG. 4c depicts a (unit) helically interleaved address sequence for code length 5, depth 4.
FIG. 4d illustrates coordinatization of the helical interleaved block of FIG. 4c.

The coordinatization of the helical interleaver is the procedure for projection of the desired helical symmetry onto a one dimensional (simple sequential) address space for implementation in standard ram. For a block interleaver as with any rectangular array, the projection is achieved with a single counter or the equivalent for generation of the address sequence. For the helical interleaver of the present invention, two counters are used to generate the address sequence. One approach is suggested by considering that the desirability of minimizing the delay and therefore the ram size requirement in analogy to the optimized block interleaver discussed above. All code symbols of the helical block need not be present concurrently. The writing of a symbol λ into a location currently containing δ requires that δ first be written to the channel. It is also observed that the helical array is suggested by the shape of a triangular sub-array of a rectangular matrix. Taken together, these observations have been used to construct the helical array addressing in the manner shown in FIGS. 4a and 4b using the upper and lower triangular sub-arays of a symmetric n×n matrix.

Conceptually the symbols are written in the codeword sequence in columnar order and the channel sequence appears in respective rows. The reflection symmetry and consideration of the time sequence demonstrates that the upper and lower triangular sub-arrays correspond to the same triangular array of $n(n-1)/2$ elements. Thus, the maximum interleaving depth is $n-1$.

Figures 4B, 5:
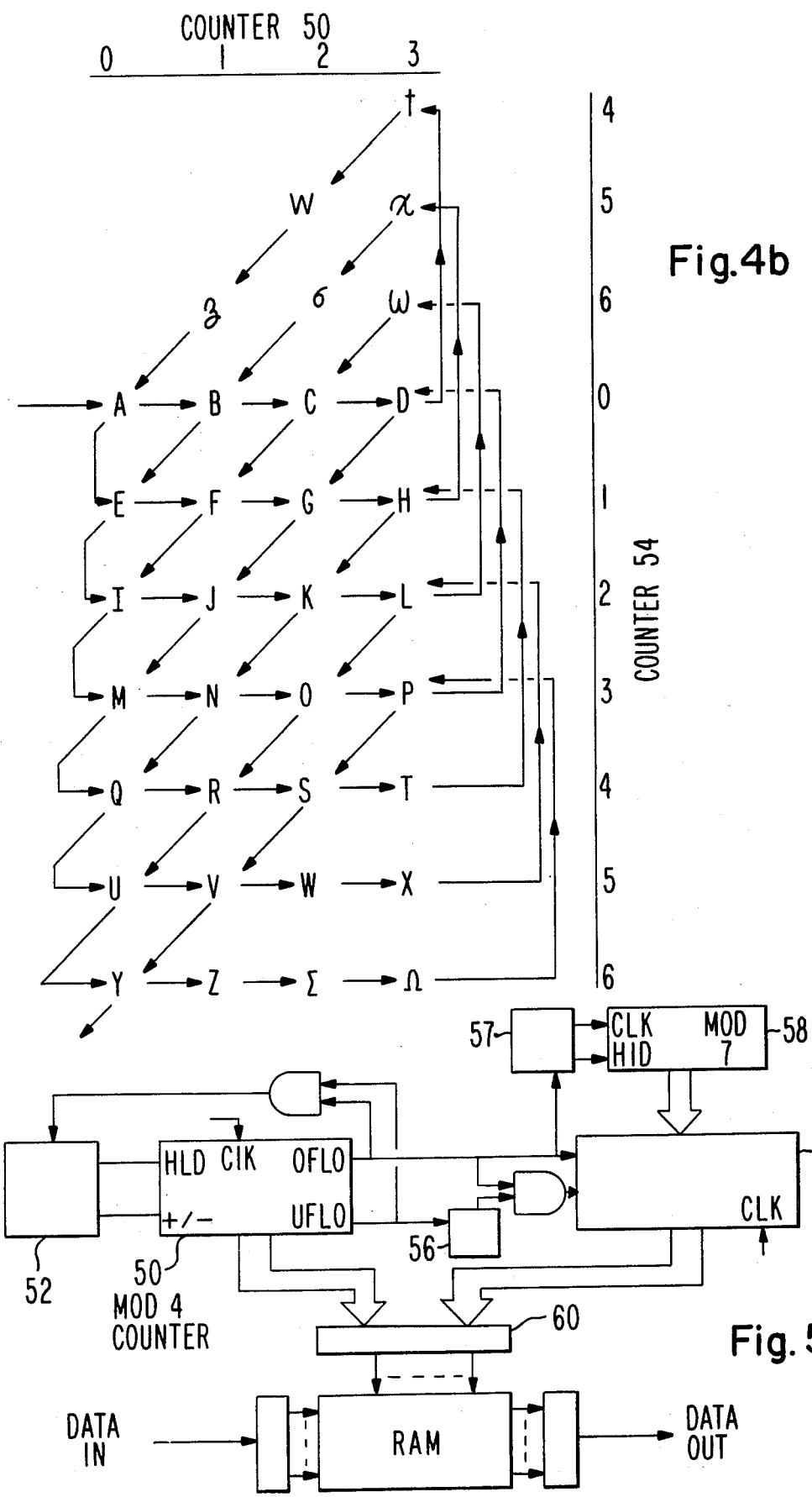

One realization of address sequence generation for the helical array is exemplified in FIG. 4b wherein a progression in the horizontal direction from A to D is created by a "horizontal" counter while a second "vertical" counter remains in a static condition at the value 0. At the right hand extreme position, the horizontal counter is in an overflow (OFLO) condition and as a consequence, the horizontal counter enters a single clock hold condition and also reverses its counting sense. The horizontal OVLO condition also causes a reset of the vertical counter to a value which progresses in a simple incremental manner at each succeeding reset. The reset interval (here 4) permits the vertical counter to increment mod i(=7 for the example) in step with the now reversed down count of the horizontal counter. At the extreme left hand limit of the horizontal counter an underflow (UFLO) condition is created and the horizontal counter again enters a single cycle hold and reverses its counting sense. Thus the horizontal counter is oscillatory with a one clock internal hold at its extremes. The UFLO condition also causes, following the hold of the horizontal counter, a hold condition for the vertical counter, persisting over the 4 clock range of the horizontal counter. The vertical counter has first incremented once during the UFLO induced hold, thereby addressing the first code symbol of the next codeword.

The optimized coordinatization is illustrated in FIG. 4b where the content of the boxes are the addresses of the 8×7 block helically interleaved in accord with the invention. Each access of the address is understood to retrieve the current content of that address for disposition to the channel followed by a write to the same address of a new datum from the encoder.

The implementation of the addressing sequence is carried out preferentially with a pair of counters which directly synthesize the addresses. The coordinatization pictured in FIG. 4b shows that the columns alternate as 0, 1, 2, 3, 2, 1, 0, 1, ... In FIG. 5a the sequence is realized by a mod 4 binary counter which reverses its counting sense at the overflow and underflow conditions, preserving its content during the sense reversal. For the helical interleaver of FIG. 5a, this is accomplished in up/down counter 50 wherein the overflow condition (OFLO) toggles the sense of the counter 50 while entering a hold condition to retain the counter content through the next clock pulse using representative logic 52. The second counter 54 is somewhat more complex. For a code interleaved to depth 7, counter 54 is mod 7 and is reset to an incremented value triggered by the OFLO of counter 50. This reset is obtained when the OFLO condition toggles the counter direction control following which the next clock pulse is counted. The value to which counter 54 is reset may be generated from other data in some cases. A convenient form of maintaining the correct reset value is here shown as reset counter 55. An OFLO condition causes counter 54 to reset (that is, to load the content of counter 55). After an appropriate delay counter 55 increments once and enters a hold status. An optional address assembly register 60 maps the address component data from counters 50 and 54 to form the effective address for memory access. A simple concatenation of these two counter contents is an example of the address assembly but other functional relationships may be employed where desired. Counter control logic 52, 56 and 57 are not unique and may be selected from combinations of standard digital logic elements for the specified function. For the (8,7) case, the content of the various counters during the 56 steps of the model interleaving cycle are shown in Table I. The arguments of the function realized by address assembly register 60 are indicated in lieu of a specific effective address. Parenthesized comments suggest the operations which accompany selected states.

TABLE I

| \multicolumn{5}{c|}{ADDRESS SYNTHESIS FOR N = 8. DEPTH = 7} | | | | |
|---|---|---|---|---|
| time | symb | address 60 | counter 50 | counter 54 | counter 58 |
| 0 | A | 0,0 | 0 (+1) | 0 (hold) | 4 (hold) |
| 1 | B | 1,0 | 1 | 0 | 4 |
| 2 | C | 2,0 | 2 | 0 | 4 |
| 3 | D | 3,0 | 3 (OFLO) | 0 (reset) | 4 |
| 4 | t | 3,4 | 3 (hold,−1) | 4 (+1) | 4 (+1) |
| 5 | w | 2,5 | 2 | 5 | 5 (hold) |
| 6 | z | 1,6 | 1 | 6 | 5 |
| 7 | A (a) | 0,0 | 0 (UFLO) | 0 | 5 |
| 8 | E | 0,1 | 0 (hold,+1) | 1 (hold) | 5 |
| 9 | F | 1,1 | 1 | 1 | 5 |
| 10 | G | 2,1 | 2 | 1 | 5 |
| 11 | H | 3,1 | 3 (OFLO) | 1 (reset) | 5 |
| 12 | x | 3,5 | 3 (hold,−1) | 5 (+1) | 5 (+1) |
| 13 | σ | 2,6 | 2 | 6 | 6 (hold) |
| 14 | b | 1,0 | 1 | 0 | 6 |
| 15 | E (e) | 0,1 | 0 (UFLO) | 1 | 6 |
| 16 | I | 0,2 | 0 (hold,+1) | 2 (hold) | 6 |
| 17 | J | 1,2 | 1 | 2 | 6 |
| 18 | K | 2,2 | 2 | 2 | 6 |
| 19 | L | 3,2 | 3 (OFLO) | 2 (reset) | 6 |
| 20 | ω | 3,6 | 3 (hold,−1) | 6 (+1) | 6 |
| 21 | c | 2,0 | 2 | 0 | 6 (+1) |
| 22 | f | 1,1 | 1 | 1 | 0 (hold) |
| 23 | I (i) | 0,2 | 0 (UFLO) | 2 | 0 |
| 24 | M | 0,3 | 0 (hold,+1) | 3 (hold) | 0 |
| 25 | N | 1,3 | 1 | 3 | 0 |
| 26 | O | 2,3 | 2 | 3 | 0 |
| 27 | P | 3,3 | 3 (OFLO) | 3 (reset) | 0 |
| 28 | d | 3,0 | 3 (hold,−1) | 0 (+1) | 0 (+1) |
| 29 | g | 2,1 | 2 | 1 | 1 (hold) |
| 30 | j | 1,2 | 1 | 2 | 1 |
| 31 | M (m) | 0,3 | 0 (UFLO) | 3 | 1 |
| 32 | Q | 0,4 | 0 (hold,+1) | 4 (hold) | 1 |
| 33 | R | 1,4 | 1 | 4 | 1 |
| 34 | S | 2,4 | 2 | 4 | 1 |
| 35 | T | 3,4 | 3 (OFLO) | 4 (reset) | 1 |
| 36 | h | 3,1 | 3 (hold,−1) | 1 (+1) | 1 (+1) |
| 37 | k | 2,2 | 2 | 2 | 2 (hold) |
| 38 | n | 1,3 | 1 | 3 | 2 |
| 39 | Q (q) | 0,4 | 0 (UFLO) | 4 | 2 |
| 40 | U | 0,0 | 0 (hold,+1) | 0 (hold) | 2 |
| 41 | V | 1,0 | 1 | 0 | 2 |
| 42 | W | 2,0 | 2 | 0 | 2 |
| 43 | X | 3,0 | 3 (OFLO) | 0 (reset) | 2 |
| 44 | l | 3,2 | 3 (hold,−1) | 2 (+1) | 2 (+1) |
| 45 | o | 2,3 | 2 | 3 | 3 (hold) |
| 46 | r | 1,4 | 1 | 4 | 3 |
| 47 | U (u) | 0,5 | 0 (UFLO) | 5 | 3 |
| 48 | Y | 0,6 | 0 (hold,+1) | 6 (hold) | 3 |
| 49 | Z | 1,6 | 1 | 6 | 3 |
| 50 | ε | 2,6 | 2 | 6 | 3 |
| 51 | Ω | 3,6 | 3 (OFLO) | 6 (reset) | 3 (+1) |
| 52 | P | 3,3 | 3 (hold,−1) | 3 (+1) | 4 (hold) |
| 53 | s | 2,4 | 2 | 4 | 4 |
| 54 | v | 1,5 | 1 | 5 | 4 |

TABLE I-continued

| \multicolumn{5}{c|}{ADDRESS SYNTHESIS FOR N = 8. DEPTH = 7} | | | | |
|---|---|---|---|---|
| time | symb | address 60 | counter 50 | counter 54 | counter 58 |
| 55 | Y (y) | 0,6 | 0 (UFLO) | 6 | 4 |

Initialization, power up and system reset functions are not shown. These are unnecessary for illustration of the essential principles of the addressing sequence and are well within the state of the art. The above described coordinatization is a preferred form of helical address projection onto a one dimensional address space.

An odd length codeword differs slightly in coordinatization. Table II is an example for the case n=5, i=4. The address is again implemented with two counters. In analogy to the above even n example, the coordinatization is schematicized by FIG. 4c and FIG. 4d. For n=5, the horizontal counter is bidirectional, mod 3 and the vertical counter is mod 4. The odd n symmetry imposes an anharmonic oscillatory behaviour on the horizontal counter 50: the imminent overflow condition (OFLO) produces no single cycle hold condition between sense reversal and resume count. The vertical counter 54 operates as above described. Reset of this counter is triggered as before by the OFLO signal and the reset value increments from its previous value. The UFLO signal then initiates a hold condition, remaining in a hold condition until next clocked by the OFLO signal.

TABLE II

| \multicolumn{5}{c|}{ADDRESS SYNTHESIS FOR N = 5. DEPTH = 4} | | | | |
|---|---|---|---|---|
| time | symb | address 60 | counter 50 | counter 54 | counter 58 |
| 0 | A | 0 | 0 (+1) | 0 (hold) | 3 (hold) |
| 1 | B | 1,0 | 1 | 0 | 3 |
| 2 | C | 2,2 | 2 (OFLO,−1) | 0 (reset) | 3 |
| 3 | D | 1,3 | 1 | 3 (+1) | 3 (+1) |
| 4 | A | 0,0 | 0 (UFLO) | 0 | 0 (hold) |
| 5 | E | 0,1 | 0 (hold,+1) | 1 (hold) | 0 |
| 6 | F | 1,1 | 1 | 1 | 0 |
| 7 | G | 2,3 | 2 (OFLO,−1) | 1 (reset) | 0 |
| 8 | B | 1,0 | 1 | 0 (+1) | 0 (+1) |
| 9 | E | 0,1 | 0 (UFLO) | 1 | 1 (hold) |
| 10 | H | 0,2 | 0 (hold,+1) | 2 (hold) | 1 |
| 11 | I | 1,2 | 1 | 2 | 1 |
| 12 | C | 2,2 | 2 (OFLO,−1) | 2 (reset) | 1 |
| 13 | F | 1,1 | 1 | 1 | 1 (+1) |
| 14 | H | 0,2 | 0 (UFLO) | 2 | 2 (hold) |
| 15 | J | 0,3 | 0 (hold,+1) | 3 (hold) | 2 |
| 16 | D | 1,3 | 1 | 3 | 2 |
| 17 | G | 2,3 | 2 (OFLO,−1) | 3 (reset) | 2 |
| 18 | I | 1,2 | 1 | 2 | 2 (+1) |
| 19 | J | 0,1 | 0 | 1 | 3 (hold) |

The structure of a de-interleaver for recovering the original sequence follows from the structure of the interleaver. The addressing sequence is generated following the same principle described above.

Other means for obtaining the characteristic stairstep boundary of helical symmetry will readily occur to one of skill in the art. For example, where part count and data rate permit, the sequence may in fact reside in a conventionally addressed rom. The data ram of the interleaver or de-interleaver is then indirectly addressed through the rom.

The concept of stagger in helical interleavers is a quantitative expression of the relative time displacement on the channel of correspondingly positioned code symbols in successive codewards. The conventional block interleaver is characterized by a time displacement D=1 between such symbol pairs. The helical interleaver shown in FIG. 3 is characterized by a delay of D=i+1 between correspondingly positioned symbols of successive codewords. The quantity D can be expressed as $D=\alpha i+\beta$. The helical interleaver may be generally identified with the case $|\alpha|\geq 1$, $|\beta|\neq 0$. (Absolute value symbols introduced to encompass either sense of helicity will be ignored in the remainder of this work.) For the case of unit stagger (FIGS. 3a, 6a and 6b) $(\alpha/\beta)=1$; For shallow stagger (FIG. 6c) $(\alpha/\beta)>1$. For deep stagger (FIG. 6d) the apparent extension of this approach, $(\alpha/\beta)<1$ is accurate if the idea of "corresponding position" is clearly understood. "Corresponding position" is subject to some ambiguity for the case of deep stagger where a set of adjacent consecutive codewords form a subset of the interleaved code which has the local attributes of block interleaving, eg. D=1. At the boundary of the subset, the delay between "correspondingly positioned" code symbols of adjacent codewords astride the boundary follows the helical form $D=\alpha i+\beta$, but the "correspondence" and "adjacency" in such instance ignores the ordering within the subset. When the correspondence and adjacence refer to the internal organization of the subset structure, the concept of deep interleaving reduces to unit helical interleaving. (This observation leads to concatenation of interleavers for realization of deep and shallow helices as discussed below). An alternative compact characterization for helical symmetry can be defined in terms of the average of the delays, $\overline{D}$, between correspondingly positioned code symbols of (originally) adjacent codewords. The average need only be taken over i consecutive symbol pairs. For all helical interleavers the quantity $\overline{D}>1$. It is apparent that the quantity $\overline{D}=D$ for block and for both unit and shallow helical interleavers. Generalizing to an expression for delay in the form $D=i+\gamma$, one can distinguish the cases $\gamma>1$ and $\gamma<1$ which are conveniently labeled shallow and deep stagger. It is also appropriate to note that the order of successive code words does not effect this concept and the stagger can be implemented in either sense shown in FIGS. 6a and b. It is only essential that the quantity D (or $\overline{D}$) divides the codelength n.

Figure 6B:
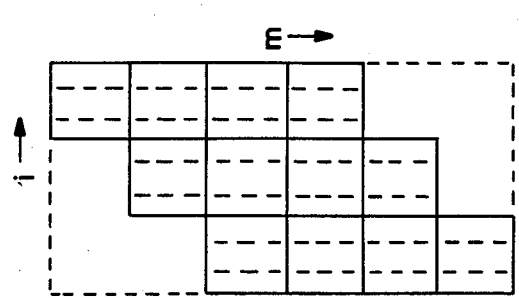
FIG. 6a, b schematicize the symmetry of unit stagger.
FIG. 6c, d respectively schematicize deep and shallow stagger.
Figure 6A:
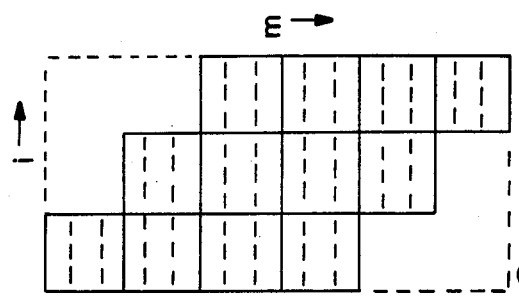

Deep or shallow stagger can be realized by concatenation of interleaver hardware or alternatively, by concatenation of code symbols to derive "supersymbols" for unit stagger helical interleaving (delay of i+1 between correspondingly positioned symbols of adjacent codewords) yielding the desired stagger for the actual code symbol. It is apparent in the latter approach that shallow stagger results from a concatenation of adjacent code symbols of the same code word. An example is exhibited in FIG. 6a where the dashed lines show that a supersymbol code length 4 interleaved to depth 3 contains a microcode of length 12, depth 3. Deep stagger results from concatenation of corresponding symbols of successive codewords. FIG. 6b indicates an example of deep stagger in the microsymbol components (dashed lines) of a supersymbol set for code length 4, depth 3. From the point of view of the supersymbol set, the stagger parameter $\gamma=1$ for either deep or shallow stagger. On the basis of individual code symbols, the deep stagger interleaving exhibits a delay, for correspondingly positioned code symbols of successive code words, varying from a delay, D=1, as with a block interleaver, to $D=i+1$, the latter value occuring across the stairstep. The "average delay", $i+\gamma$ is an appropriate variable for parameterization of the set of delays where the average is taken over $i-1$ delays between i correspondingly positioned symbols and $\gamma<1$ for deep stagger. For shallow and unit stagger, the delay between correspondingly positioned code symbols does not vary; consequently the average is identical to the constant individual delays.

A major distinction between helical and conventional (block) interleavers may be ascertained in the synchronization requirement. A block interleaver must acquire and maintain character synchrony modulo (ni) for the n-length code interleaved to depth i. The corresponding helical interleaver can be implemented with synchronization period modulo n. The natural position for synchronization information is at the boundary, or stairstep of the helical block. The synchronization symbol is preferably appended to the codeword by the encoder as the final symbol of the codeword.

As is well known, errata, which form the subject of error protection schemes, comprise both errors and erasures. The location of an erroneous symbol in a data stream and the correct identity of that symbol is, a priori, unknown. For an erasure, the location of the fault is known or determinable; only the correct identity of the erased symbol is unknown. Usually, erasures are a consequence of time correllative conditions, the most common being a fade of signal due to channel conditions. One may posit apparatus sensitive to the signal-to-noise ratio characterizing the channel for detecting a fade condition. As a result of detecting a fade, the affected symbols may be flagged as erasures and treated accordingly. In the present invention, knowledge of a location(s) of an errata condition is exploited by a general scheme denominated "burst forecasting" which can substantially equal the performance of an ideal fade detector in a burst error protection apparatus.

Figure 7A:
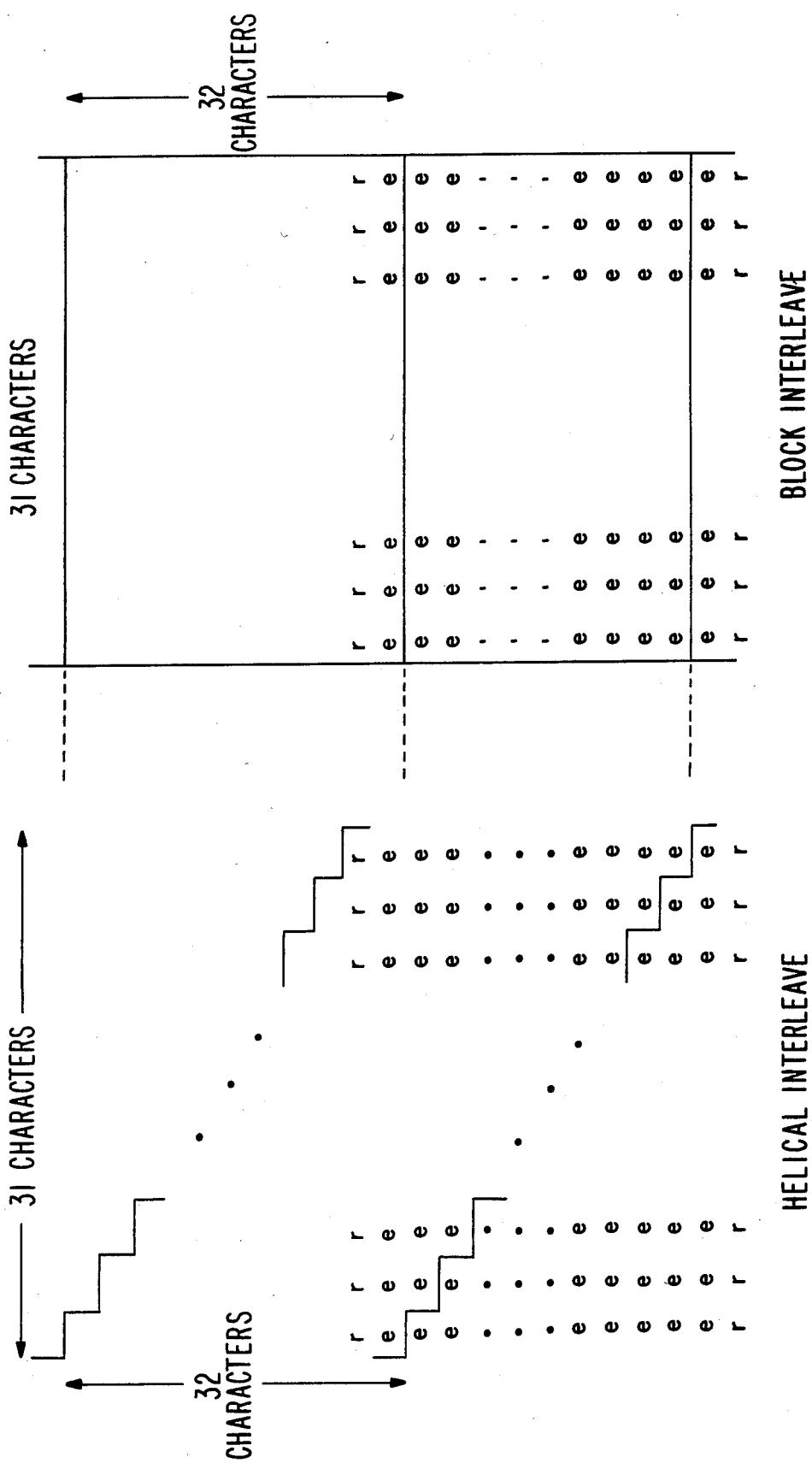
FIG. 7a illustrates the mapping of a long burst in the helical interleaved information of the present invention.

The concept of the ideal fade detector is useful for comparison of various interleavers. The ideal fade detector creates erasure characters during a fade of the channel. Assuming that in each case the information stream is representative of the identical Reed-Solomon (32,24) code, it is desired to compare the performance with an ideal fade detector of a depth 31 helical interleaver, a depth 16 block interleaver, a pseudo random interleaver and no interleaver. The comparisons are based upon apparatus exhibiting roughly the same memory and delay requirement; hence, the selected depth parameters. It is assumed that a fade, equivalent in duration to B characters, is superimposed upon a random bit error rate of $10^{-6}$. The calculation proceeds from the examination of a semi-infinite fade of selected phase (commencing at the last character of a codeword). Under this condition, the decoder successively processes incremental erasures until the number of erased characters exceeds the redundancy of the code. The decoded bit error rate asymptotically approaches 50%. The map of a long erasure burst in a representative helical interleaver is shown in FIG. 7a. The letters e and r denote respectively an erased and a received (non-erased) character.

Figure 7B:
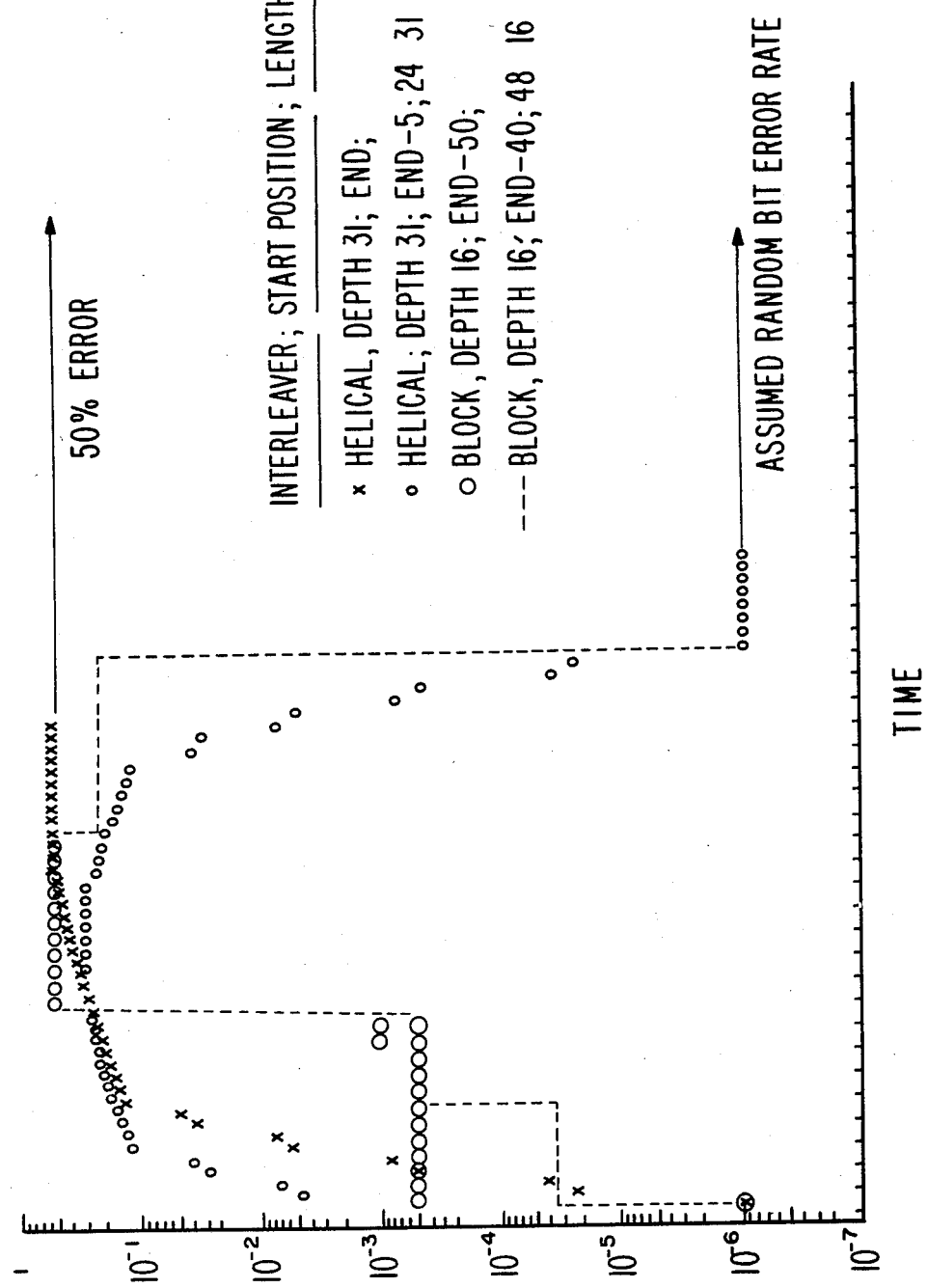
FIG. 7b compares degradation of helical and comparable block interleavers for slightly different burst phase.
Figure 8A:
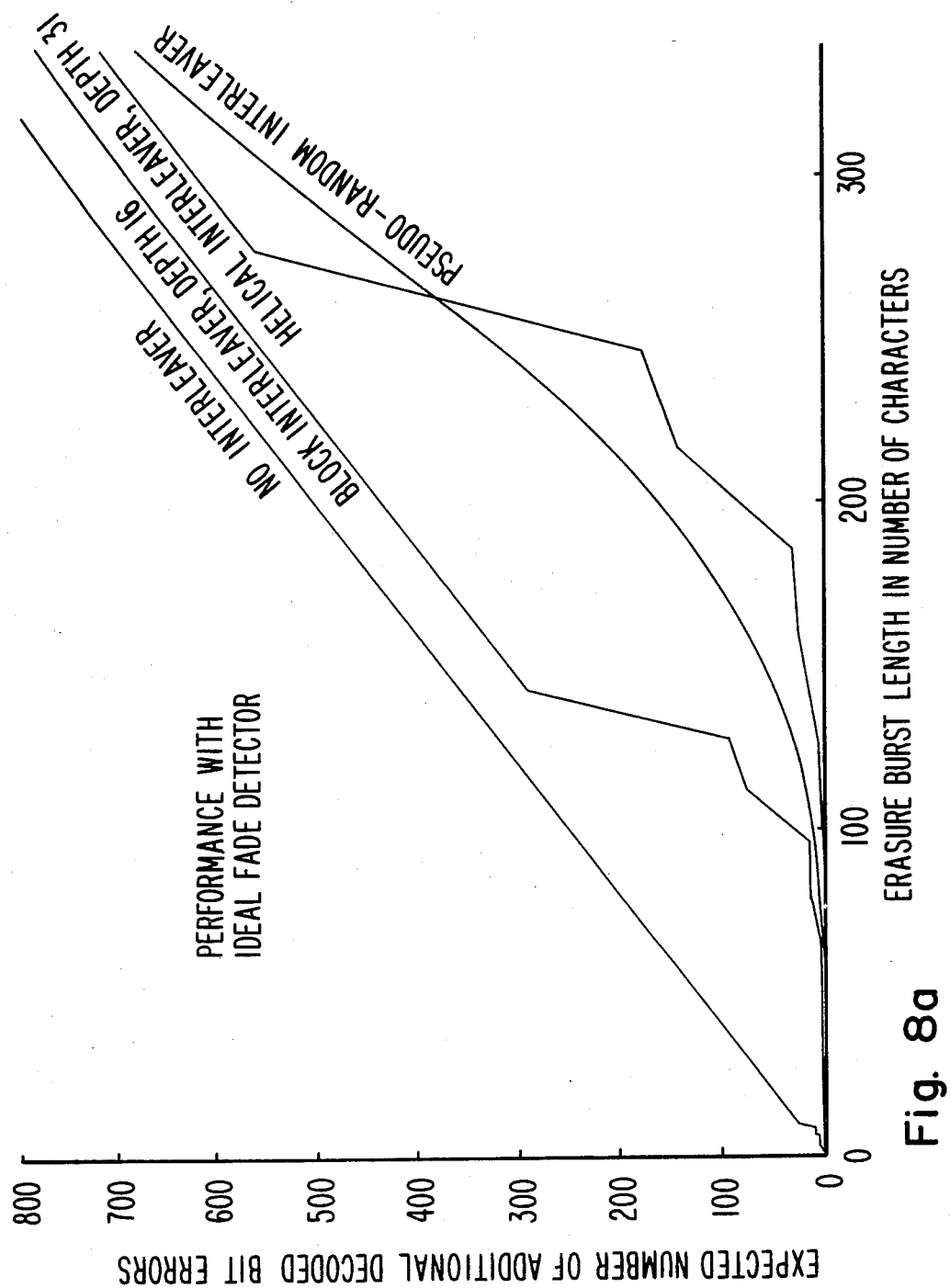
FIG. 8a compares performance of several interleavers with an ideal fade detector.

A degradation curve for both the helical and comparable block interleavers is shown at FIG. 7b where the phase of the comparable burst is slightly varied. It will be observed that the block interleaver is clearly more phase dependent than the helical interleaver. For either interleaver, recovery from the burst follows roughly the same trajectory in the time reversed sense. The block interleaver is therefore subject to further phase dependence defined by the conclusion of the burst. For analysis of the realistic problem of a finite fade, B characters in length, the residual bit error rate is subtracted from the curves of FIG. 7b and the resulting function integrated from t=0 to infinity, then averaged over all phases to obtain the number of expected additional decoded errors due to a burst of length B. This analytic comparison is shown in FIG. 8a.

Figure 8B:
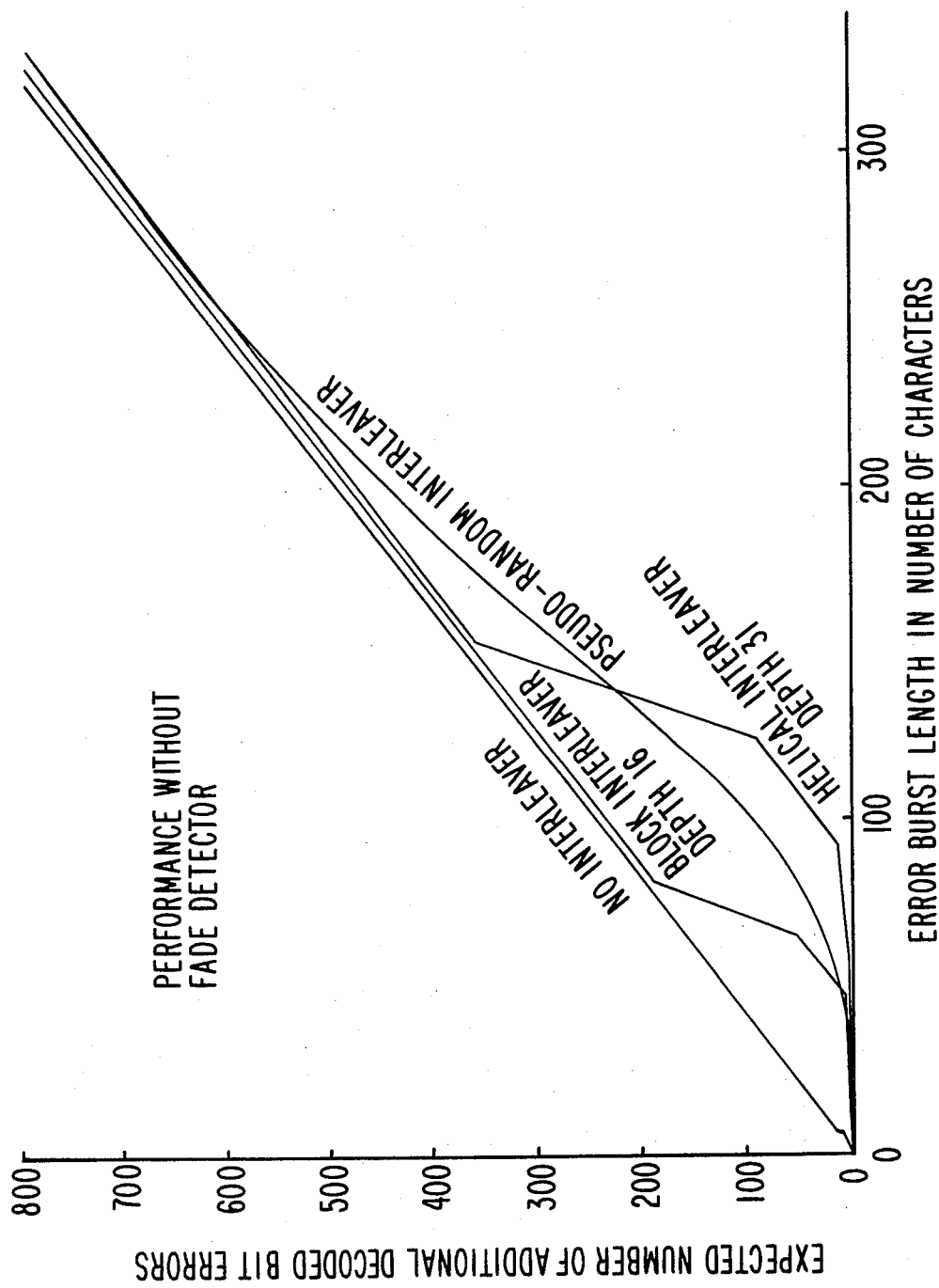
FIG. 8b compares the performance of the several interleavers of FIG. 8a without the ideal fade detector.
Figure 8C:
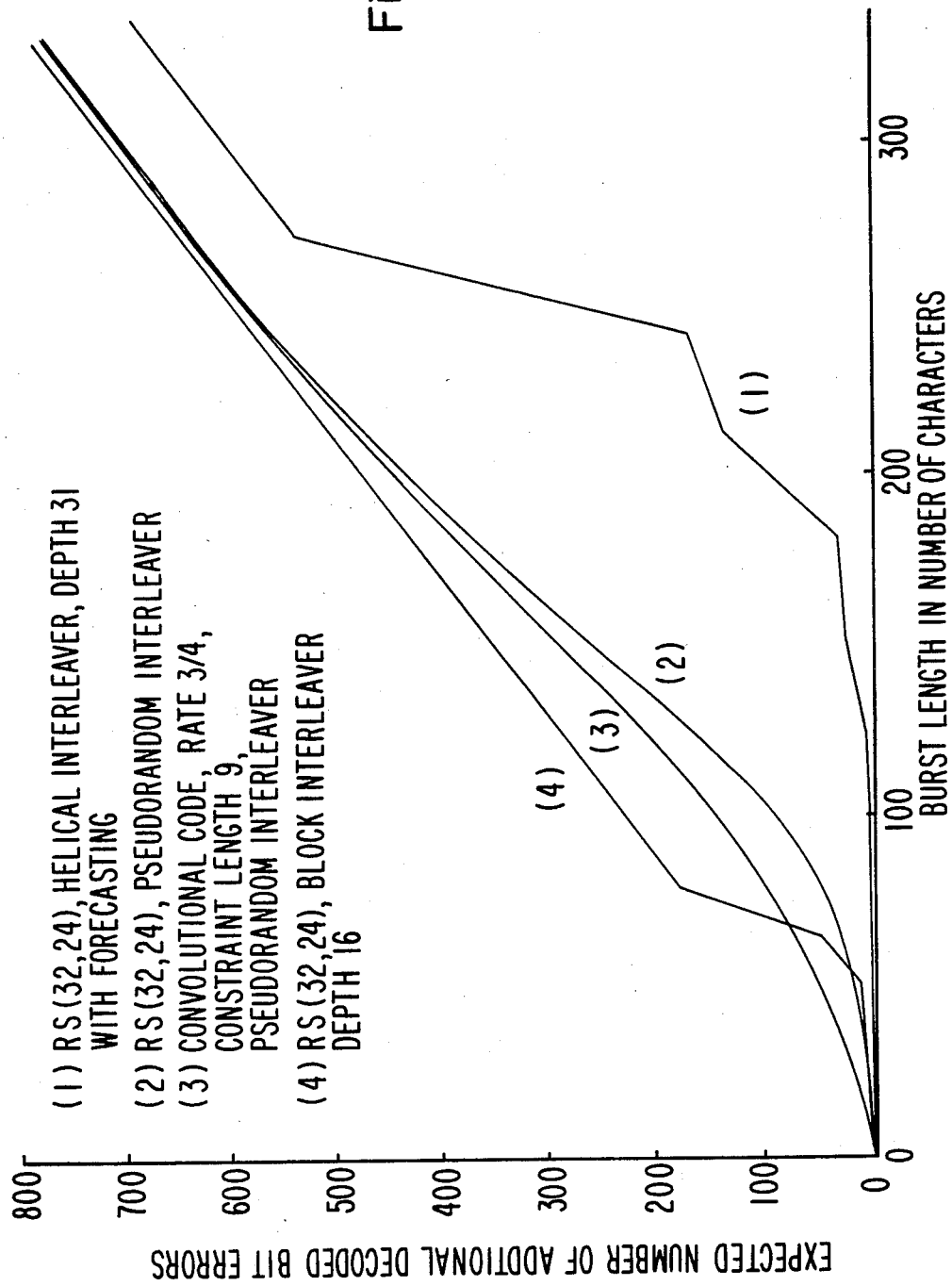
FIG. 8c compares a helical burst forecasting interleaver with alternative real interleavers.

If now the assumption of an ideal fade detector is discarded, the same analysis yields the comparison shown in FIG. 8b. The superior performance of the interleavers of FIG. 8a can be recovered in a real system by the burst forecasting method of the present invention. Thus the relevant comparison is that of a helical interleaver including burst forecasting with, for example, a real pseudo-random interleaver (without ideal fade detector). This comparison is shown in FIG. 8c which directly compares the data of FIGS. 8a and 8b.

Burst forecasting is unusually well adapted for helically interleaved code. If the characters of the presently decoded codeword are labeled $\alpha^{-1}, \alpha^{-2}, \ldots, \alpha^{+2}, \alpha^{+1}, 0$, then a confirmed error location $\alpha^j$ of the present codeword is contiguous in time on the channel with the location $\alpha^{j+1}$ of the subsequent adjacent codeword. Should error be detected at location $\alpha^j$ of the present codeword, burst forecasting predicts erasure at the subsequent adjacent channel time which is a well defined symbol location in the next code word if helical interleaving has been employed. The determination of error location consumes both the redundancy of the code and processing time. Assume, for example, a confirmation of error within the next codeword as it is processed in the decoder (by parity check symbol, for example). Without consuming the redundancy requisite to further localizing the error or processing time, the burst forecasting method supplies the probable location of the erasure based upon the error location in the previous word. The conserved redundancy is then expendable for correction of a larger volume of errata. For the case of Reed-Solomon codes, knowledge of the error location effectively doubles the number of errors which can be corrected. Helically interleaved Reed-Solomon codes in combination with burst forecasting perform asymptotically as well as the ideal fade detector.

Figure 9:
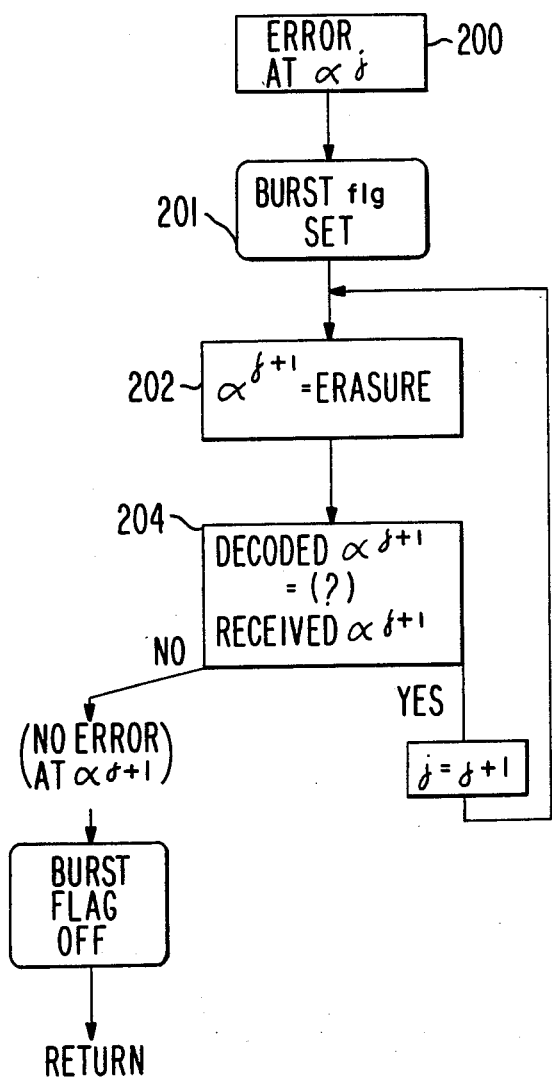
FIG. 9 illustrates the logic implementing burst forecasting.

The burst forecasting strategy is best illustrated by FIG. 9 for implementation via hard wired logic or stored instruction sequence. Errata detected at symbol $\alpha^j$, logic module 200, sets a burst in progress flag at 201 causing prediction of error at the time adjacent symbol $\alpha^{j+1}$. This is executed by block 202 on the assumption that a fade or burst of indeterminate length had commenced (or continues). Accordingly, the symbol $\alpha^{j+1}$ is flagged as an eraure for treatment by the decoder. The focus of this logic is the interleaver symmetry, which is preferably helical for simple and reliable operation. Whether the predicted erasure in fact occurs is ascertained at 204 from a comparison of the received symbol with the decoded erasure symbol. If the comparison indicates that symbol $\alpha^{j+1}$ did in fact contain error the predicted erasure is extended to the next time adjacent symbol $\alpha^{j+2}$. The progression is maintained so long as the burst remains active as indicated by the confirmed presence of errata in consecutive codewords. If error is no longer present in a subsequent codeword (received symbol and decoded erratum agree), the burst or fade is terminated and the logical sequence of burst forecasting need not be entered until error is next detected.

Burst forecasting can also be implemented with block interleavers, although with reduced effectiveness compared to the helical interleavers. Consider a block interleaving system employed to re-sequence an RS code characterized by redundancy r and interleaving depth i. A burst of length $b > (r+1) i/2$ is undecodable for all codewords of the block and the forecasting technique fails for this block interleaver. A burst of length sufficient to so defeat decoding for a block interleaver, will result in but one undecodable codeword for helical interleaving, because the subsequent helically interleaved codewords are progressively displaced from the burst locus. Using helical interleaving in combination with burst forecasting, a burst as long as $b = ri$ characters can be decoded correctly. Thus, burst forecasting has a much greater beneficial effect for helical interleaving. The comparison of FIG. 7a for a long burst in both helical and block interleaver demonstrates the relatively strong phase dependence of the latter compared with helical interleaving. For a block interleaver, the technique by itself, is subject to ambiguity for certain burst phases because there is no fixed position in the data stream from which forecasting can begin. This is due to the lack of continuity from which pairs of code symbols, adjacent in time on the channel, correspond to known relative positions in the de-interleaved symbol stream. For a pair of adjacent codewords within the block, the relationship is indeed simple: corresponding code symbol positions within adjacent codewords are adjacent on the channel. However, at the extreme columns (codewords) of the block interleaver a different relationship obtains. To obtain the benefits of burst forecasting for a block interleaver, further indexing symbols or supplemental phase identification would be required to inform the burst forecaster of this discontinuity. In contrast, the helical interleaver exhibits the continuity of a helix and no additional "indexing" symbols are required beyond the necessary synchronization.

In order to establish the correct partition of the bit stream into symbols and the symbol stream into blocks, a synchronization symbol is periodically inserted into the transmitted data at the data source and recognized at the data sink. A novel synchronization method is realized in the present invention. Every block length interval contains Q bit intervals or phases where Q is the number of bits per block, including the unique synchronization symbol. Without a priori information, any one of a string of Q bits may be the initial bit of the synchronization symbol at the initiation of operation. The present invention associates a counter to each phase of the block. The content of each individual counter will be a number which measures the likelihood that the corresponding phase is the synch bit, eg. the initial (or preferably, the final) bit of the c bit synchronization (synch) pattern. The terminology "phase counter" will be used employed to denote these phase associated counters. The incoming data transits a window c bits long (symbols are assumed to comprise c bits) and at each bit time a compare is effected between the window content and the reference representation of the synch symbol. A true result of this comparison causes incrementation of the corresponding counter and a false result decrements the same counter. Clearly, the prevalence of false results tends to drive all counters except one toward the minimum likelihood condition. The spurious identification of c contiguous bits matching the synchronization symbol will occur, with small probability, $p=2^{-c}$, causing an incrementation of the corresponding counter, but that spurious eventuality is tolerable because the correct phase counter is synchronously incremented. The indicia of correct synch is chosen to be the condition of maximum probability corresponding to counter overflow. The length of the counter therefore determines the precision to which the probability for erroneous synchronization is known. The calculation of the probability of mis-synch is based upon a random walk constrained by reflecting barriers at 0 and $v-1$ where these barriers correspond to the extrema of probability for the synchronization condition. It can be shown in the steady state approximation that the probability that a counter contains a value greater or equal to v is approximately given by $$P(v) = \left(\frac{p}{1-p}\right)^v$$

In a realistic example $p=2^{-5}$ and $v=16$. Maximum probability is $(31/32)^{-16}$ and the probability of counter overflow for a random data stream is approximately $e^{\frac{1}{2}} 10^{-24}$. For an exaggerated data rate of $10^{12}$ sec$^{-1}$, the mean free time between mis-synch symbols is $e^{-\frac{1}{2}} \times 10^{15}$ seconds $> 1.9 \times 10^5$ centuries.

The time (number of blocks) required for one of the counters to reach its overflow condition is an important descriptor of performance for the present synchronization method. For a large value of v, more data will be lost before the synch condition is determined, but the reliability of the determination will be correspondingly enhanced. A value of $v=16$ is arbitrarily selected and the time for acquiring the synch condition can be computed recognizing that for each block of data the correct phase counter will be decremented with probability of p and incremented with probability 1-p for a net gain of 1-2p where p is the channel symbol error rate. Ignoring underflow and initializing the counters at 0, the overflow value 16 will be exceeded after m blocks whenever (1-2p)m > 16

For five bit symbols and independent bit errors the synch aquisition time m is computed for several values of channel error rate in Table II.

TABLE III

| | Expected Synch Acquisition Time | |
|---|---|---|
| p (bit) | p (character) | Interval to synch (blocks) |
| 0.00 | 0.00 | 16 |
| 0.01 | 0.05 | 17.7 |
| 0.02 | 0.10 | 20.0 |
| 0.05 | 0.23 | 29.6 |
| 0.07 | 0.30 | 40.9 |
| 0.10 | 0.41 | 88.9 |
| 0.13 | 0.50 | infinite |

The time to acquire the synchronization condition is clearly affected by the initialization of the phase counters. To initialize the counters at 0 imposes a condition of maximum interval before the synch indecation condition is indicated. A false synch merely postpones the acquisition of the correct synch condition. An initialization at the midpoint of the counter capacity appears to better reflect the physically random condition obtaining with the occurence of a start-up or other search for synchronization. However, it has been found in the present work that an optimum initialization amplitude for the phase counters is best chosen rather more proximate the maximum amplitude. For the example illustrated above (4 bit phase counter) an initial value of 12 or 13 has been found to be optimal.

Figure 10:
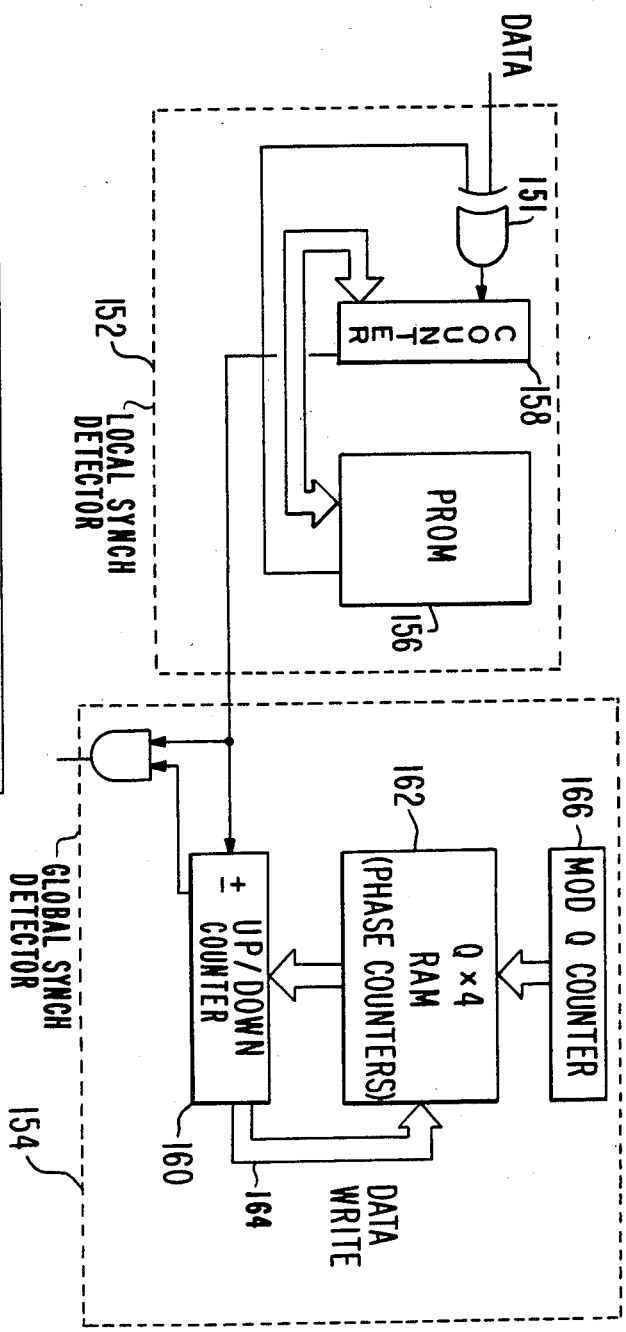
FIG. 10 is an illustrative block diagram for the sync acquisition apparatus of the present invention.

Turning now to FIG. 10, the above described method for synchronization has been implemented in a form based upon two main operative constituents: a local sync detector 152 and a global sync detector 154. It is the function of the local sync detector 152 to examine each c bit symbol, advancing one bit at a time. The current c bit pattern is compared with the reference pattern corresponding to the sync symbol to obtain a signal for incrementing or decrementing the corresponding phase counter. This is accomplished by executing a microprogram stored in prom 156 as addressed by counter 158. A sync bit pattern from the prom 156 is compared with the incoming data bit in gate 151. The counter is reset or executes a jump in accordance with the disagreement or concurrence respectively of the current sync bit and data bit. As concurrence of the incoming data pattern with the reference sync symbol continues, the counter advances toward an overflow condition. When the most recent c bits are congruent with the sync pattern overflow occurs and a signal is asserted controlling the bidirectional counter 160 to increment the content of the currently addressed phase counter returning this updated content to the phase counter through data write path 164. The phase counter is a uniquely addressed bit field of the ram 162. The address is established by autonomous mod Q counter 166 which cycles through Q addressable elements of the ram 162. Lack of an overflow assertion level causes the bidirectional counter 160 to decrement the currently addressed phase counter.

The bidirectional counter 160 simply receives the content of the currently addressed ram element and performs the required arithmetic (current content $+/-1$), testing underflow and overflow conditions and writing back the updated content to the same ram element. The value written back is required to be greater than the underflow condition and less than the overflow condition. The occurence of the overflow condition asserts a carry level which is then used to establish a reset to the de-interleaver and define the synchronization condition for de-interleaver and decoder.

As previously noted, a major advantage in helical interleaving is a reduction in the synchronization period. Because the sync character occurs relatively frequently, it can comprise relatively fewer bits with the consequence that the aforementioned ram element need not be large. The repetition rate for transmission of synchronization information increases for helically interleaved code, eg. to n(n-1)i for a helical interleaver from ni for the block interleaver.

Since many changes can be made in the described construction and many apparently widely differing embodiments of the invention can be made without departing from the scope thereof, it is intended that all matter contained in the above description and accompanying drawings shall be interpreted as illustrative and not in a limiting sense.

What is claimed is:

1. The method of determining a synchronization condition defined by periodically transmitting a synchronization symbol comprising c bits in addition to an information block comprising M bits, said M+c bits comprising M+c phases of the transmission period for the block, comprising the steps of
  (a) associating a respective finite capacity counter with each phase for measuring the relative probability that each said phase marks the synchronization condition,
  (b) comparing each c bits of said M+c bits with a representation of said synchronization symbol,
  (c) incrementing that phase associated counter corresponding to a specific bit of the c bit pattern currently compared upon the result of said comparing step establishing congruence of said c bit pattern with said representation, or
  (d) decrementing that phase associated counter corresponding to a specific bit of the c bit pattern currently compared, upon the result of said comparing step establishing non-congruence of said c bit pattern with said representation, and,
  (e) generating a synchronization signal upon overflow of any one of said phase associated counters.

2. The method of claim 1 wherein said step of associating further comprises the step of initializing the content of said phase associated counters at respective non-zero values.

3. Apparatus for synchronization of data transmission between information source and information sink, said transmission comprising a block of bits including a combination of at least one block of information symbols and at least one synch symbol, said synch symbol comprising c bits and said information symbols comprising M bits, said apparatus comprising
  (a) local synch detector means for detecting the occurrence of a predetermined synch bit pattern, comprising
    first means for testing as received c bit patterns a first c contiguous bit pattern and a plurality of successive such patterns beginning with a second c contiguous bit pattern, wherein the first bit of the second pattern is the second bit of the first pattern and, for the remaining patterns, the first bit of each such remaining pattern being one bit removed from the first bit of the immediately prior pattern, all said bit patterns defined over the range of said at least M+c bit-length block of uniformly spaced bits, said first means including
    comparison means for comparing each said received c bit pattern to a representation of said synch symbol and generating a binary valued congruence signal indicative of the congruence of each said received c bit pattern to said representation,
  (b) global synch detector means comprising
    (1) a plurality of at least M+1 storage elements, each said storage element associated with a respective unique c contiguous bit pattern defined over the range of said M+c bits,
    (2) means for incrementing or decrementing the content of the storage element corresponding to the c bit pattern currently subject to said comparison, said incrementation or decrementation responsive to the respective value of said binary congruence signal,
    (3) synch signal generating means for generating a synch signal whenever the content of any one of said storage elements exceeds a predetermined value.

4. The apparatus of claim 3 further comprising means for creating said c bit symbol and inserting said symbol in said data transmission.

* * * * *